United States Patent
Tong et al.

(10) Patent No.: US 6,716,739 B2
(45) Date of Patent: Apr. 6, 2004

(54) BUMP MANUFACTURING METHOD

(75) Inventors: Ho-Ming Tong, Taipei (TW); Chun-Chi Lee, Kaohsiung (TW); Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/063,574

(22) Filed: May 3, 2002

(65) Prior Publication Data
US 2003/0157789 A1 Aug. 21, 2003

(30) Foreign Application Priority Data
Feb. 19, 2002 (TW) ........................ 91102775 A

(51) Int. Cl.$^7$ .......................... H01L 21/4763
(52) U.S. Cl. ................. 438/613; 438/698; 438/632
(58) Field of Search .................. 438/613, 614, 438/612

(56) References Cited

U.S. PATENT DOCUMENTS

| | | | | |
|---|---|---|---|---|
| 5,162,257 A | * | 11/1992 | Yung | 438/613 |
| 5,486,282 A | * | 1/1996 | Datta et al. | 205/123 |
| 5,508,229 A | * | 4/1996 | Baker | 438/613 |

* cited by examiner

Primary Examiner—Wael Fahmy
Assistant Examiner—Hoa B. Trinh
(74) Attorney, Agent, or Firm—Jiang Chyun IP Office

(57) ABSTRACT

A method of forming bumps on the active surface of a silicon wafer. A first under-ball metallic layer is formed over the active surface of the wafer. A second under-ball metallic layer is formed over the first under-ball metallic layer. A portion of the second under-ball metallic layer is removed to expose the first under-ball metallic layer. A plurality of solder blocks is implanted over the second under-ball metallic layer. A reflux operation is conducted and then the exposed first under-ball metallic layer is removed so that only the first under-ball metallic layer underneath the second under-ball metallic layer remains.

112 Claims, 7 Drawing Sheets

BUMP MANUFACTURING METHOD

CROSS REFERENCE TO RELATED APPLICATIONS

This application claims the priority benefit of Taiwan application serial no. 91102775, filed Feb. 19, 2002.

BACKGROUND OF INVENTION

1. Field of Invention

The present invention relates to a method of manufacturing bumps. More particularly, the present invention relates to a process of fabricating bumps that require a shorter contact period with etchant and a thinner photoresist layer.

2. Description of Related Art

In this information explosion age, electronic products are used almost everywhere. Computer and processing stations driven by powerful integrated circuits are employed in offices, educational institutions, recreational industries, business and commercial companies. As electronic technology continues to progress, products having more powerful functions and more attuned to personal needs are developed. Furthermore, most electronic products are increasingly light and compact thanks to the efficient fabrication of many types of high-density semiconductor packages. A major innovation is the flip chip design capable of cramming a considerable number of integrated circuits together. In a flip-chip design, a plurality of bumps is formed on the bonding pads of a silicon chip. Each bump directly contacts with a corresponding contact point on a substrate so that the chip and the substrate are electrically connected. Compared with the conventional wire-bonding and tape automated bonding (TAB) method of joining a chip with a substrate, the flip-chip design has a shorter overall conductive path and hence a better electrical connectivity. In addition, the backside of the chip may be exposed to facilitate heat dissipation during operation. Due to the distinguishing advantages of flip-chip packages, semiconductor manufacturing favors its production.

FIGS. 1 to 7 are partially magnified cross-sectional views of structures on the surface of a silicon wafer showing the progression of steps for producing bumps on the wafer according to a conventional method. As shown in FIG. 1, a silicon wafer 110 is provided. The wafer 110 has an active surface 112. The wafer 110 further includes a passivation layer 114 and a plurality of bonding pads 116 (only one of them is shown) on the active surface 112 of the wafer 110. The passivation layer 114 exposes the bonding pad 116.

As shown in FIG. 2, an adhesion layer 120 is formed over the active surface 112 of the wafer 110 by conducting a sputtering operation. The adhesion layer 120 covers the bonding pad 116 and the passivation layer 114. Thereafter, a barrier layer 130 is formed over the adhesion layer 120 by conducting a sputtering or an electroplating operation. A wettable layer 140 is formed over the barrier layer 130 by conducting a sputtering or an electroplating operation. Here, the fabrication of a so-called under-ball metallic layer 142 is complete. The under-ball metallic layer 142 actually is a composite layer comprising the adhesion layer 120, the barrier layer 130 and the wettable layer 140.

As shown in FIG. 3, a photolithographic operation is conducted by forming a photoresist layer 150 over the wettable layer 140, exposing the photoresist layer 150 to light and then developing the photoresist layer. Ultimately, a pattern (not shown) is transferred to the photoresist layer 150. The photoresist layer 150 now contains a plurality of openings 152 (only one is shown) that exposes the wettable layer 140 above the bonding pad 116.

As shown in FIG. 4, metal is deposited to refill the opening by conducting an electroplating operation so that a plurality of solder blocks 160 (only one is shown) is formed inside the opening 152 of the photoresist layer 150. The solder block 160 completely covers the exposed wettable layer 140.

As shown in FIGS. 4 and 5, the photoresist layer 150 is completely removed from the top of the wettable layer 140.

As shown in FIGS. 5 and 6, the under-ball metallic layer 142 outside the solder block 160 region is removed by etching. Consequently, only the residual under-ball metallic layer 142 remains underneath the solder block 160. The passivation layer 114 above the wafer 110 is now exposed.

As shown in FIG. 7, a reflux operation is conducted by sprinkling flux over the wafer 100 and heating to a temperature such that the solder block 160 starts to melt and turns into a hemispherical shape bump 170. The bump 170 is actually a composite structure that includes the under-ball metallic layer 142 and the solder block 160.

In the fabrication process as shown in FIGS. 1 to 7, etchant is used to remove the wettable layer 140, the barrier layer 130 and the adhesion layer 120 in sequence (not shown). During etching, the etchant may come in contact with the solder block 160 and etch away a portion of the solder block 160 layer. Hence, overall thickness of the solder block 160 may be reduced leading to material wastage and difficulty in controlling solder block 160 quality. Furthermore, when the etchant for etching the wettable layer 140 and the barrier layer 130 is improperly prepared, the etchant may act on the solder block 160. The etchant may peel off the solder block 160 from the wettable layer 140 before the wettable layer 140 and the barrier layer 130 are removed. Moreover, to match the dimension of the under-ball metallic layer 160, cross-sectional area of the opening 152 in the photoresist layer 150 must be set to a small value so that the solder block 160 inside the opening 152 is thick. Consequently, the photoresist layer 150 must have comparable thickness resulting in a higher cost of production.

SUMMARY OF INVENTION

Accordingly, one object of the present invention is to provide a process of fabricating bumps capable of reducing contact with etchant and the wasting of solder blocks so that the solder block is more accurately shaped.

A second object of this invention is to provide a process of fabricating bumps such that the peeling of solder blocks due to etchant is prevented.

A third object of this invention is to provide a process of fabricating bumps that involves the formation of an opening having a large cross-sectional area in a photoresist layer during the photolithographic process. Consequently, a smaller amount of metallic material needs to be deposited into the opening and the resulting solder block has a minimal height. Ultimately, a thinner photoresist layer is required and hence production cost is reduced.

Note in the following description that the use of the preposition "over" as in "a second layer is formed over a first layer" means that the second layer is either in contact with the first layer or simply above the first layer.

To achieve these and other advantages and in accordance with the purpose of the invention, as embodied and broadly described herein, the invention provides a process of fabricating bumps on a silicon wafer. The wafer has an active surface with a passivation layer and a plurality of bonding pads thereon. The passivation layer exposes the bonding pads. First, an adhesion layer is formed over the active surface of the wafer. The adhesion layer covers the bonding pads and the passivation layer. A barrier layer is formed over the adhesion layer and then a wettable layer is formed over the barrier layer.

A first photolithographic process is carried out to form a plurality of photoresist blocks over the wettable layer. Thereafter, a first etching operation is conducted to remove the wettable layer and the barrier layer outside the photoresist covered region. The photoresist blocks are removed.

A second photolithographic process is carried out to form a photoresist layer over the adhesion layer. The photoresist layer has a plurality of openings that expose the wettable layer and the adhesion layer around the barrier layer. A metal-filling operation is conducted to form solder blocks inside the openings in the photoresist layer. The solder blocks cover the wettable layer and the adhesion layer around the barrier layer. The photoresist layer is removed.

A first reflux operation is carried out so that the solder block changes to a blob having a hemispherical profile and the solder block also retracts into the upper surface of the wettable layer without extending into the adhesion layer.

A second etching operation is carried out so that the exposed adhesion layer is removed while the adhesion layer underneath the barrier layer is retained. In the meantime, the passivation layer over the wafer is exposed. Finally, a second reflux operation is conducted.

According to one preferred embodiment of this invention, the second reflux operation is a selective process. In addition, the first reflux operation may be carried out before the step of removing the photoresist layer. Furthermore, the adhesion layer can be a titanium, a titanium tungsten alloy, aluminum or chromium layer, the barrier layer can be a nickel-vanadium alloy layer and the wettable layer can be a copper, palladium or gold layer.

In brief, a two-stage process is used to etch the under-ball metallic layer according to this invention. In the first state, the wettable layer and the barrier layer are etched. Since the solder blocks are not formed over the wettable layer, etchant will not attack the solder block. Etchant will contact the solder block only when the adhesion layer is etched in the second etching operation. Hence, the bump fabrication process is able to minimize volume reduction of the solder blocks due to etchant contact. Consequently, the solder blocks can have a more precise dimension.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
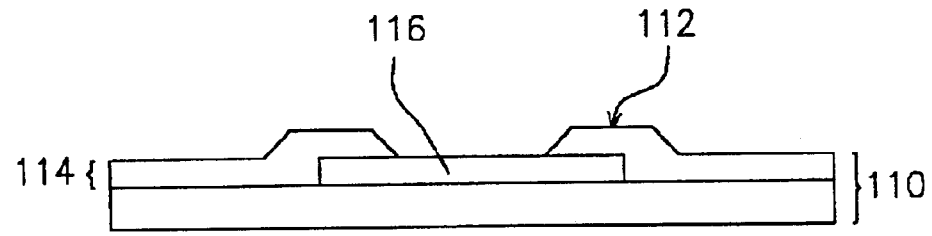
FIGS. 1 to 7 are partially magnified cross-sectional views of structures on the surface of a silicon wafer showing the progression of steps for producing bumps on the wafer according to a conventional method.
Figure 2:
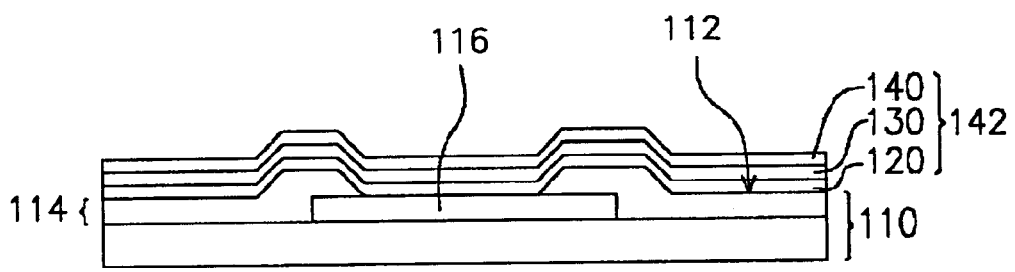
Figure 3:
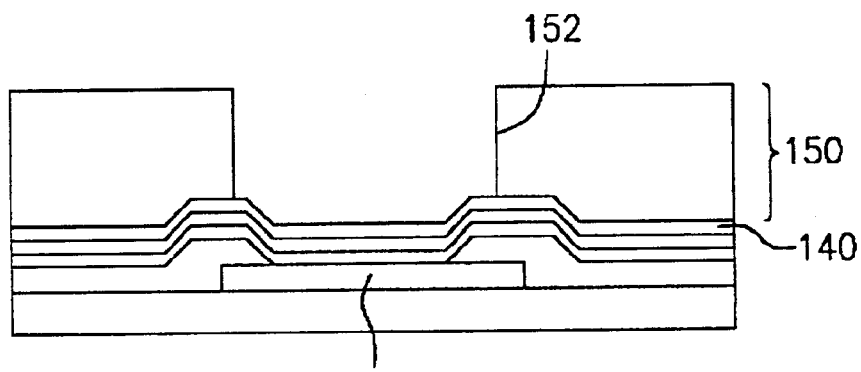
Figure 4:
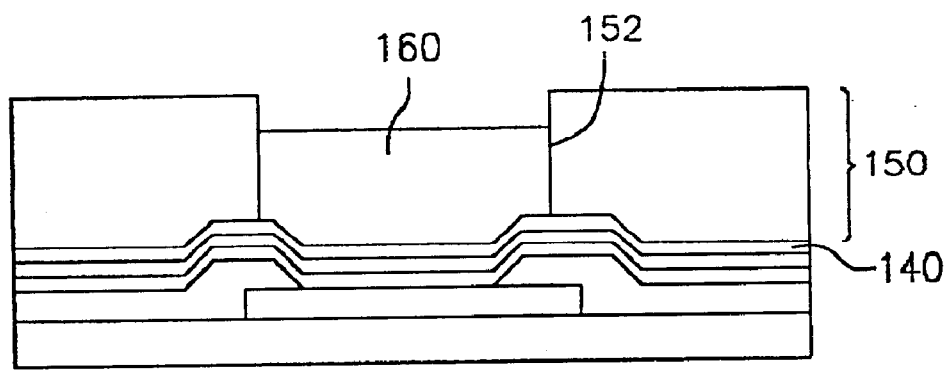
Figure 5:
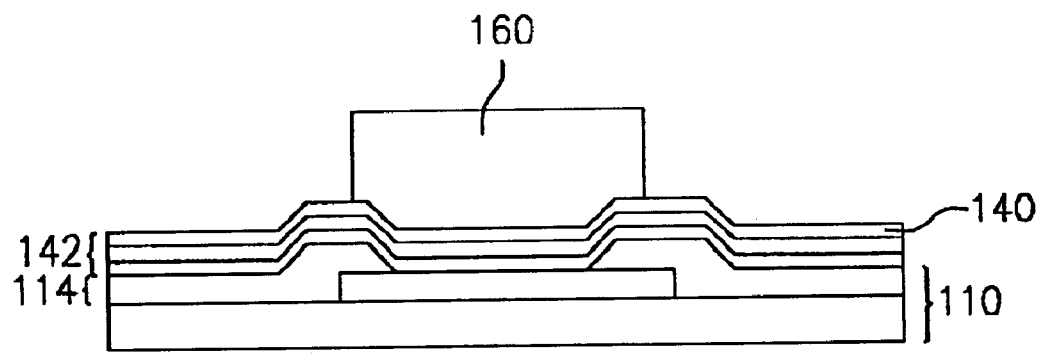
Figure 6:
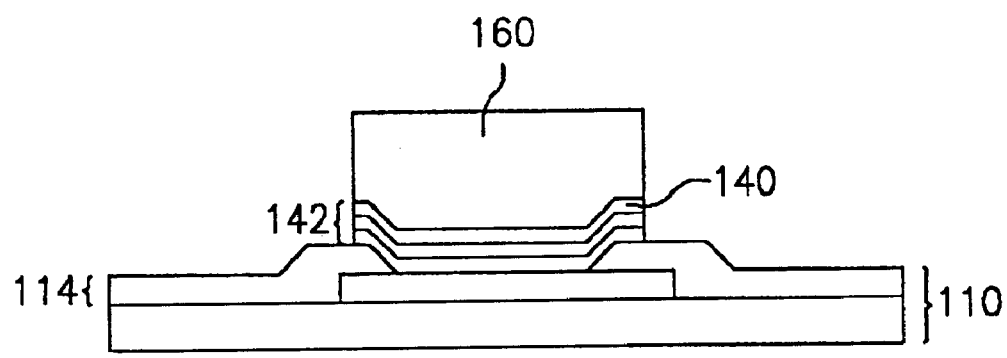
Figure 7:
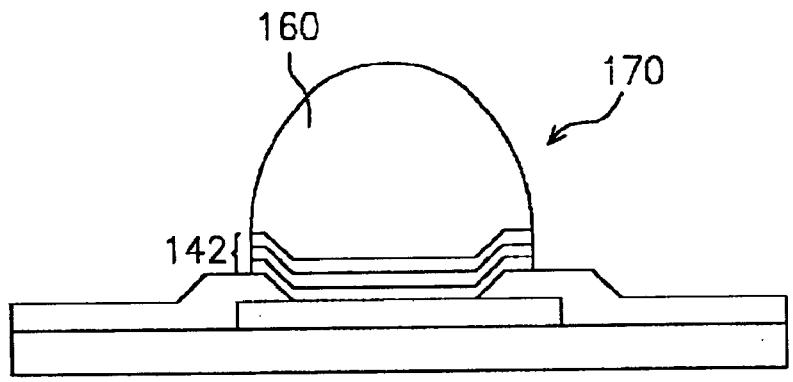

Reference will now be made in detail to the present preferred embodiments of the invention, examples of which are illustrated in the accompanying drawings. Wherever possible, the same reference numbers are used in the drawings and the description to refer to the same or like parts.

Figure 8:
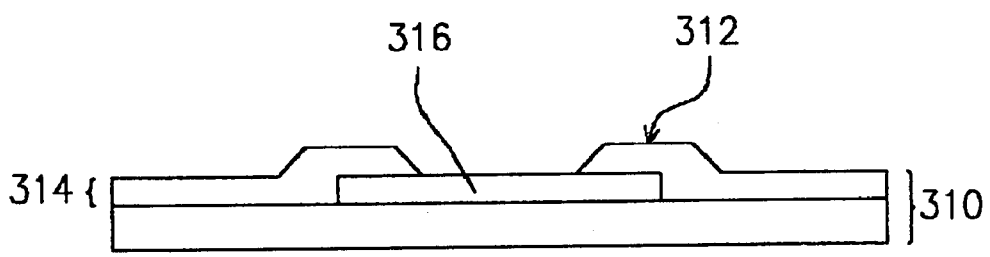
FIGS. 8 to 17 are partially magnified cross-sectional views of structures on the surface of a silicon wafer showing the progression of steps for forming bumps over a silicon wafer according to a first preferred embodiment of this invention.

FIGS. 8 to 17 are partially magnified cross-sectional views of structures on the surface of a silicon wafer showing the progression of steps for forming bumps over a silicon wafer according to a first preferred embodiment of this invention. As shown in FIG. 8, a silicon wafer 310 is provided. The wafer 310 has an active surface 312 with a passivation layer 314 and a plurality of bonding pads 316 (only one is shown) thereon. The passivation layer 314 exposes the bonding pads 316.

Figure 9:
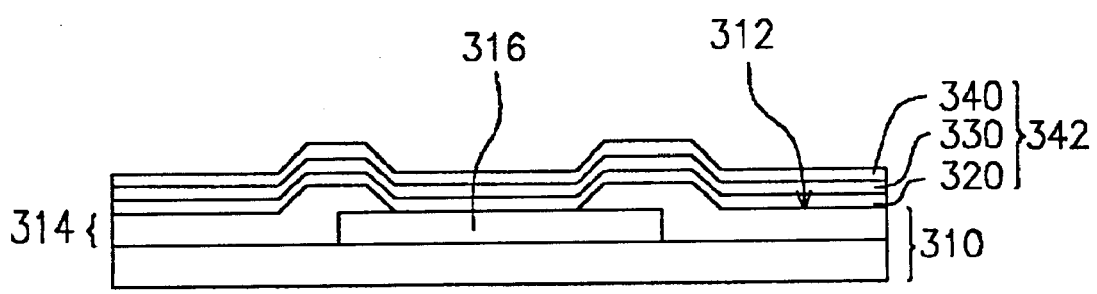

As shown in FIG. 9, an adhesion layer 320 is formed over the active surface 312 of the wafer 310 by sputtering or evaporation plating. The adhesion layer 320 covers both the bonding pads 316 and the passivation layer 314. The adhesion layer 320 can be made from a material including, for example, titanium, titanium-tungsten alloy, aluminum or chromium. A barrier layer 330 is formed over the adhesion layer 320 by sputtering, electroplating or evaporation plating. The barrier layer 330 can be made from a material such as nickel-vanadium alloy, for example. A wettable layer 340 is formed over the barrier layer 330 by sputtering, electroplating or evaporation plating. The wettable layer 340 can be made from a material including, for example, copper, palladium or gold. Hence, a so-called under-ball metallic layer 342 that comprises the adhesion layer 320, the barrier layer 330 and the wettable layer 340 is thereby formed.

Figure 10:
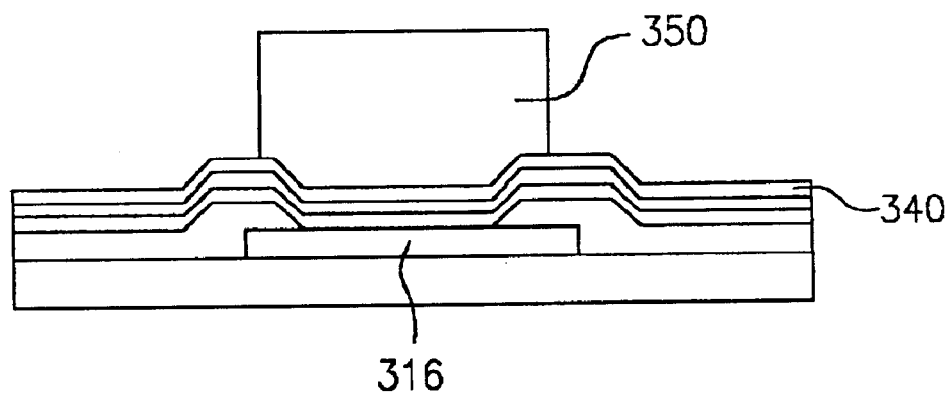

As shown in FIG. 10, a first photolithographic process is carried out by forming a photoresist layer over the wettable layer 340, exposing the photoresist layer through a mask and developing the photoresist layer chemically. Ultimately, a pattern (not shown) is transferred from the mask to the photoresist layer. In other words, a plurality of photoresist blocks 350 (only one is shown) is formed in the locations for forming the bumps directly above the bonding pads 316.

Figure 11:
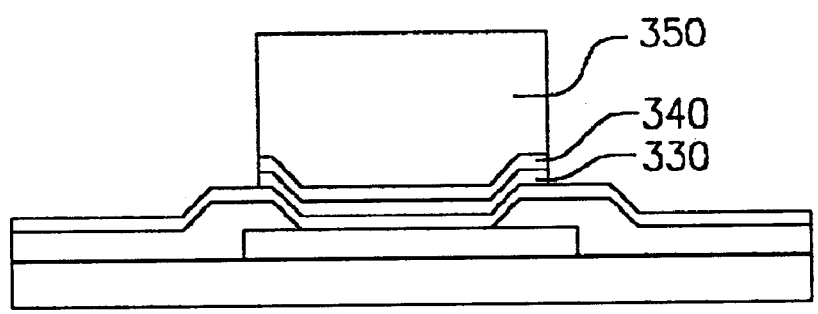

As shown in FIG. 11, a first etching operation is conducted to remove the wettable layer 340 and the barrier layer 330 outside the photoresist blocks 350 so that residual wettable layer and barrier layer remain underneath the photoresist blocks 350. The copper wettable layer 340 is etched using an etchant containing ammonium hydroxide and hydrogen peroxide having a composition according to U.S. Pat. No. 6,222,279, or an etchant containing potassium sulfate ($K_2SO_4$) and glycerol according to U.S. Pat. No. 5,486,282 and U.S. Pat. No. 5,937,320 or some other known chemical etchants. The nickel-vanadium barrier layer 330 is etched using sulfuric acid ($H_2SO_4$) as the etchant. The actual etching operation differs according to the actual working environment and is briefly described in the following.

In a first embodiment, the barrier layer 330 is etched at room temperature using 1%~98% sulfuric acid ($H_2SO_4$). When the barrier layer 330 has a thickness between 2000 Å to 4000 Å, an etching period exceeding 2 hours is required.

In a second embodiment, the barrier layer 330 is etched at a temperature above 80° C. using 1%~98% sulfuric acid ($H_2SO_4$). When the barrier layer 330 has a thickness between 2000 Å to 4000 Å, an etching period exceeding 2 hours is required.

In a third embodiment, the barrier layer 330 is etched in an electrochemical etching operation. For example, a current density of about 0.001~0.02 A/cm$^2$, preferably 0.0025 A/cm$^2$, is passed while the etching is conducted at room temperature using 10% sulfuric acid ($H_2SO_4$). When the barrier layer 330 has a thickness between 2000 Å to 4000 Å, an etching period between 20 seconds to 110 seconds is required. However, the optimal etching period is between 20 seconds to 40 seconds. In addition, either a constant current or a pulse current may be applied during etching.

Furthermore, the nickel-vanadium barrier layer 330 may be etched using a diluted phosphoric acid solution having a composition according to U.S. Pat. No. 5,508,229.

In all the aforementioned etching processes, the active surface of the wafer is usually cleaned using de-ionized water so that any residual etchant on the bumps and active surface from a previous etching operation is removed. This ensures a higher yield after the completion of the bump manufacturing process.

Figure 12:
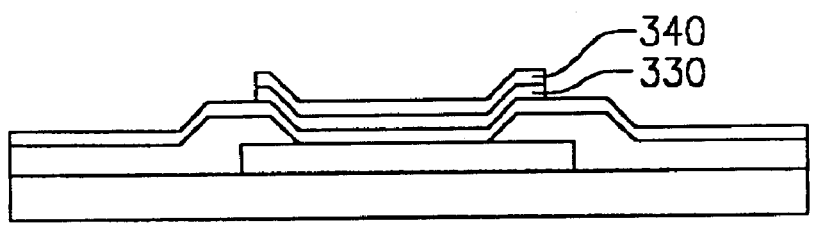

As shown in FIG. 12, the photoresist blocks 350 are removed.

Figure 13:
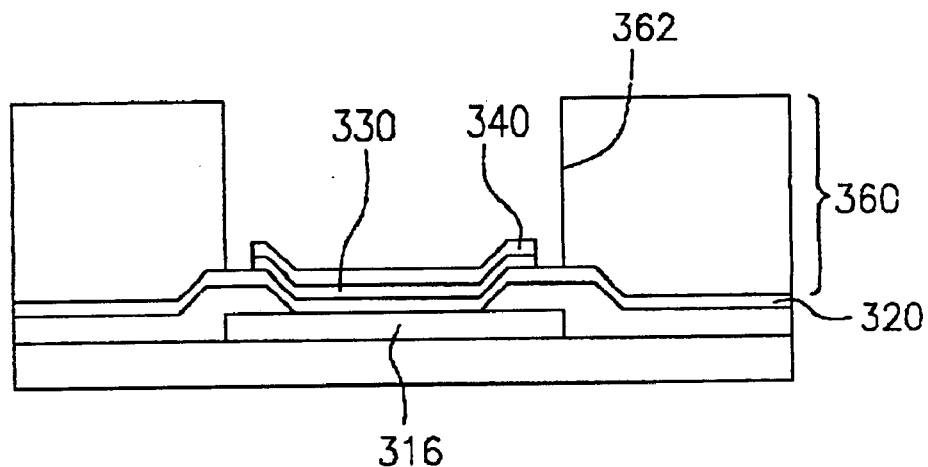

As shown in FIG. 13, a second photolithographic process is carried out to form a photoresist layer 360 over the adhesion layer 320 and the wettable layer 340. Through photo-exposure and photoresist development, a pattern (not shown) is transferred from a mask to the photoresist layer 360. The photoresist layer 360 has a plurality of openings 362 (only one is shown) that exposes the residual wettable layer 340 on the bonding pads 316 and the adhesion layer 320 around the residual barrier layer 330.

Figure 14:
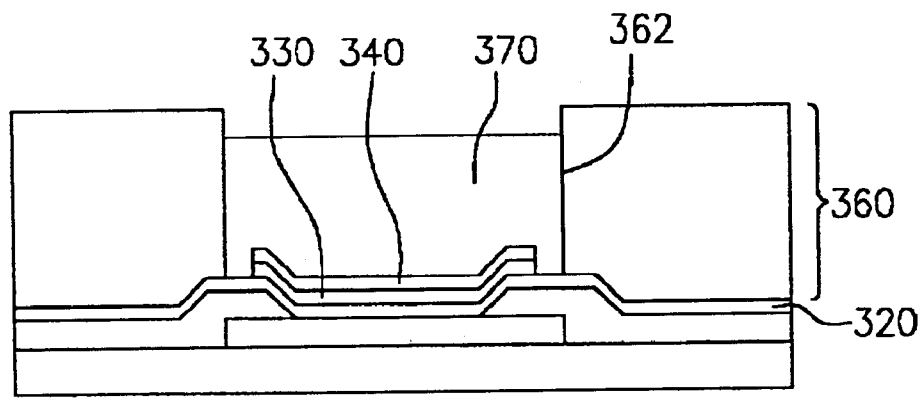
Figure 15:
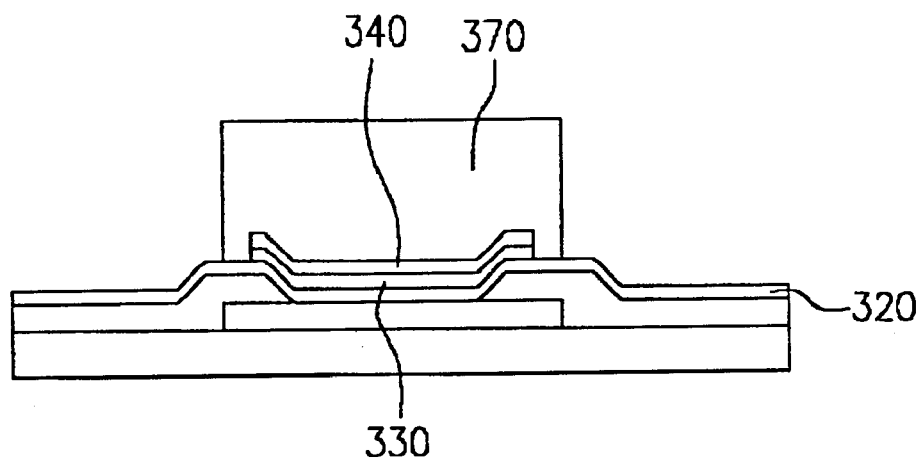

As shown in FIG. 14, metallic material is deposited into the openings 362 in the photoresist layer 360 by electroplating to form a plurality of solder blocks 370 (only one is shown). The solder blocks 370 cover the wettable layer 340 and the adhesion layer 320 around the barrier layer 330. Thereafter, the photoresist layer 360 is removed from the upper surface of the adhesion layer 320 to form a structure shown in FIG. 15.

Figure 16:
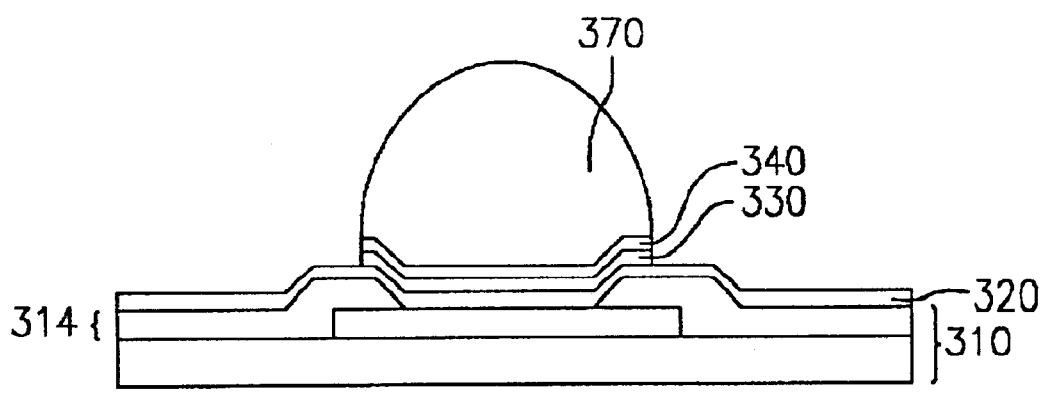
Figure 17:
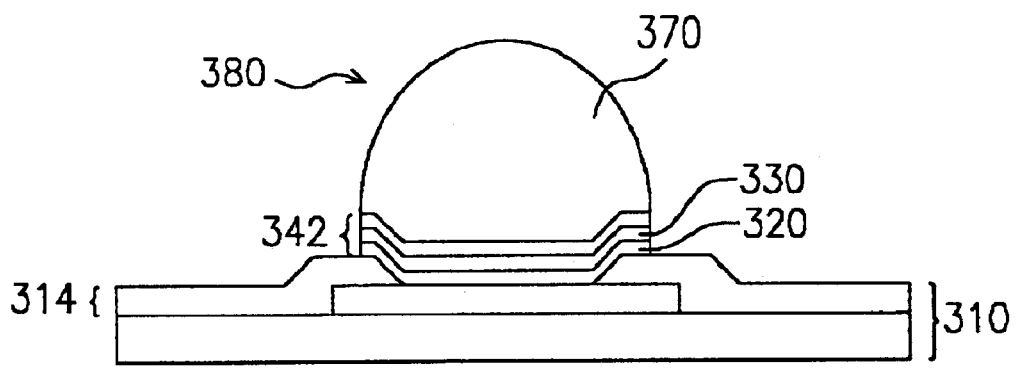

As shown in FIG. 16, a first reflux operation is carried. Flux material is sprinkled onto the wafer and the wafer is heated until the solder blocks 370 partially melt. Through the heating, the solder blocks 370 are transformed into a blob of material having a hemispherical profile. Note that material constituting the solder blocks 370 must not wet the adhesion layer 320 so that the solder blocks 370 can retract onto the upper surface of the wettable layer 340 without extending to the adhesion layer 320. Next, a second etching operation is carried out to remove the exposed adhesion layer 320 so that only the residual adhesion layer 320 underneath the barrier layer 330 remains. In the meantime, the passivation layer 314 covering the wafer 310 is exposed to form a structure as shown in FIG. 17. If the adhesion layer 320 is a titanium-tungsten alloy layer, etchant containing hydrogen peroxide ($H_2O_2$), ethylene diamine tetraacetic (EDTA) and potassium sulfate ($K_2SO_4$) and having a composition according to U.S. Pat. No. 5,462,638 can be used so that the etching effect on the solder blocks 360 is minimal. If the adhesion layer is a chromium layer, an etchant containing hydrochloric acid (HCl) having a composition according to U.S. Pat. No. 5,162,257 can be used so that the etching effect on the solder blocks 360 is also minimal. If the adhesion layer is a titanium layer, an etchant containing ammonium hydroxide and hydrogen peroxide ($H_2O_2$) having a composition according to U.S. Pat. No. 5,162,257 can be used so that the etching effect on the solder blocks 360 is also minimal. Alternatively, hydrogen fluoride (HF) can be used as an etchant for etching titanium adhesion layer 320. If the adhesion layer is an aluminum layer, an etchant containing phosphoric acid and acetic acid having a composition according to U.S. Pat. No. 5,508,229 can be used. However, during the second etching operation, the upper surface of the solder blocks 370 is also etched leading to a highly irregular surface. Hence, a second reflux operation may be introduced by selection. In the second reflux operation, flux material is sprinkled onto the wafer 310 and the wafer 310 is heated until the solder blocks 370 is planarized. This finishes the fabrication of the bumps 380. Note that each bump is a composite structure comprising an under-ball metallic layer 342 and a solder block 370. The wafer 310 is finally sliced into a plurality of chips.

In the first embodiment, the wafer 310 may be sliced into chips immediately after the second etching operation. The second reflux operation is an optional step that can be added on demand.

In the fabrication process with reference to FIGS. 8 to 17, a two-stage etching process is used to etch the under-ball metallic layer 342. During the first etching operation, that is, the etching of the wettable layer 340 and the barrier layer 330, etchant will not etch the solder blocks 370 because the solder blocks 370 are yet to be formed over the wettable layer 340. Etchant will contact the solder blocks 370 only when the adhesion layer 320 is etched in the second etching operation. Consequently, the period of contact of solder blocks 370 with etchant is reduced and hence dimensional reduction of the solder blocks 370 is minimized. Moreover, peeling of the solder blocks due to contact with etchant during fabrication is also prevented. Furthermore, the openings 362 in the photoresist layer 360 can have a larger cross-sectional area. Hence, the solder blocks 370 have a lower thickness for the same volume. Thus, a thinner photoresist layer 360 is required resulting in a lower production cost. In addition, cross-sectional profile of the openings 362 in the photoresist layer 360 can have a variety of shapes including a circular or octagonal shape.

In the aforementioned fabrication process, the reflux operation is carried out after the photoresist layer is removed. However, the reflux operation may also be carried out before photoresist removal as shown in FIGS. 18 to 21. FIGS. 18 to 21 are partially magnified cross-sectional views of structures on the surface of a silicon wafer showing the progression of steps for forming bumps over a silicon wafer according to a second preferred embodiment of this invention. In the second embodiment, only the steps that differ from the first embodiment are described.

Figure 18:
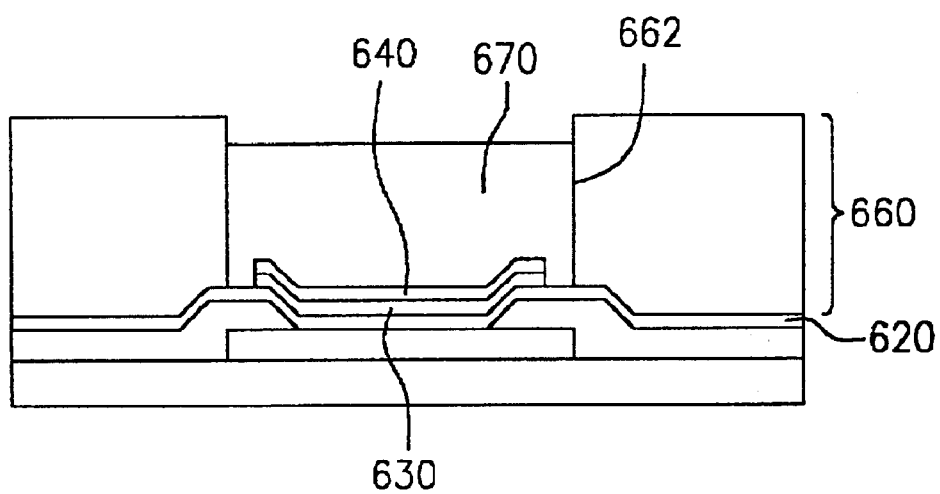
FIGS. 18 to 21 are partially magnified cross-sectional views of structures on the surface of a silicon wafer showing the progression of steps for forming bumps over a silicon wafer according to a second preferred embodiment of this invention.

As shown in FIG. 18, a metal-filling operation is conducted after the second photolithographic process. In the metal-filling operation, metallic material is deposited into the openings 662 in the photoresist layer 660 to form a plurality of solder blocks (only one is shown) by electroplating. The solder blocks 670 cover the wettable layer 640 and the adhesion layer 620 around the barrier layer 630.

Figure 19:
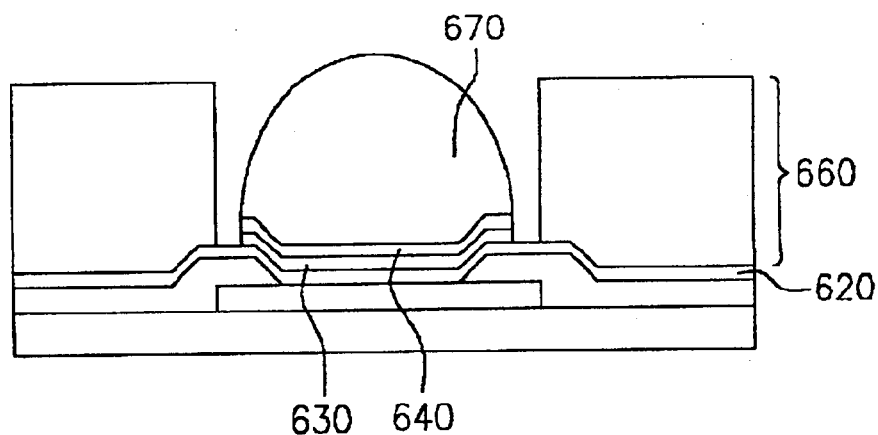
Figure 20:
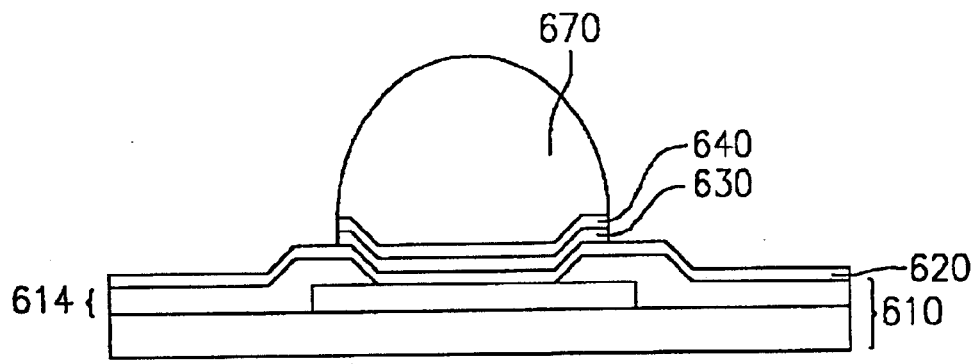
Figure 21:
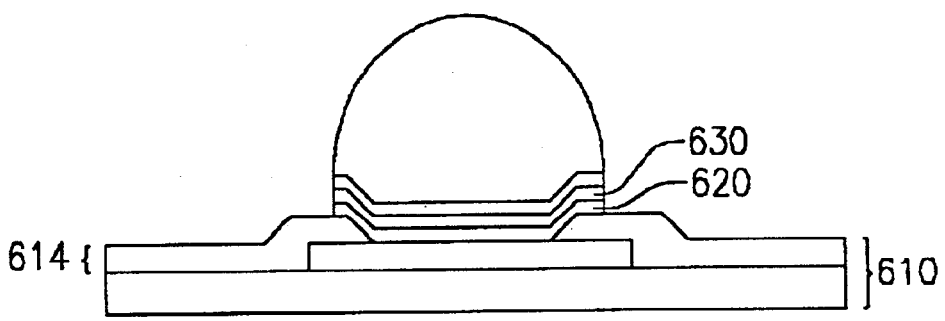

As shown in FIG. 19, a first reflux operation is conducted and then the wafer 610 is heated until the solder blocks 670 partially melt and transform into a blob of material having a hemispherical profile. In this invention, a solder material that does not wet the adhesion layer 620 is selected to form the solder blocks 670. Hence, the solder blocks 670 can retract onto the upper surface of the wettable layer 640 without extending to the adhesion layer 620. Thereafter, the photoresist layer 660 is removed from the upper surface of the adhesion layer 620 to form a structure as shown in FIG. 20. A second etching operation is carried out to remove the exposed adhesion layer 620 so that only a residual adhesion layer 620 remains underneath the barrier layer 630. The passivation layer 614 on the wafer 610 is also exposed to form a structure as shown in FIG. 21. Since the solder blocks 670 are likely etched due to contact with etchant during the second etching operation, the upper surface of the solder blocks 670 has a roughened surface. To planarize the solder blocks 670, a second reflux operation may be carried out on demand. This finishes the fabrication of the bumps 680. Note that each bump is a composite structure comprising an under-ball metallic layer 642 and a solder block 670. The wafer 610 is finally sliced into a plurality of chips.

In this invention, the reflux operation is carried out before the etching process. Hence, the deposition of metallic material to form solder blocks is not limited to electroplating. Other methods including net printing, ball implant or directly filling the photoresist opening using a scrapper are possible.

Material constituting the under-ball metallic layer is also not limited to the aforementioned. Various other types of under-ball metallic materials may similarly be applied to the fabrication of bumps as long as solder block material does not wet the adhesion layer. The solder blocks can be made from a material such as gold, tin-lead alloy or lead-free metal while the bonding pads can be made from a material such as aluminum or copper.

The under-ball metallic layer according to this invention need not be limited to just three layers (the adhesion layer, the barrier layer and the wettable layer). Other numbers of conductive layers is possible. For example, the under-ball metallic layer can be a structure with four layers, including a chromium layer, a chromium-copper alloy layer, a copper layer and a silver layer. Alternatively, the under-ball metallic layer can be a structure with two layers, including a lower layer such as a titanium-tungsten alloy layer or a titanium layer and an upper layer such as a copper layer, a nickel layer or a gold layer.

Although the bumps are directly formed on the active surface of a silicon wafer in the aforementioned embodiments, the bumps may also form elsewhere. For example, the bumps may form over a redistribution layer after the redistribution layer is formed on a silicon wafer.

In conclusion, major advantages of this invention includes:

1. A two-stage etching process is used to etch the under-ball metallic layer. During the first etching operation, that is, the etching of the wettable layer and the barrier layer, etchant will not etch the solder blocks because the solder blocks are yet to be formed over the wettable layer. Etchant will contact the solder blocks only when the adhesion layer is etched in the second etching operation. Consequently, the period of contact of solder blocks with etchant is reduced and hence dimensional reduction of the solder blocks is minimized.
2. Peeling of the solder blocks due to contact with etchant during fabrication is also prevented.
3. The openings in the photoresist layer can have a larger cross-sectional area. Hence, the solder blocks have a lower thickness for the same volume. Thus, a thinner photoresist layer is required resulting in a lower production cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method or forming bumps on a silicon wafer having an active surface with a passivation layer and a plurality of bonding pads thereon such that the passivation layer exposes the banding pads, the method comprising the steps of:

forming an adhesion layer over the active surface of the wafer, the adhesion layer covering both the bonding pads and the passivation layer, forming a barrier layer over the adhesion layer;

forming a wettable layer over the barrier layer;

conducting a first photolithography process to from a plurality of photoresist blocks on the wettable layer;

conducting a first etching operation to remove the wettable layer and the barrier layer so that only the residual wettable layer and barrier layer underneath the photoresist blocks remain;

after conducting the first etching operation, removing the photoresist blocks;

after removing the photoresist blocks, conducting a second photolithography process to form a photoresist layer over the adhesion layer, wherein the photoresist layer has a plurality of openings that expose the wettable layer and the adhesion layer around the barrier layer;

after conducting the second photolithography process, conducting a metal-filling operation to farm a solder material inside the openings of the photoresist layer, wherein the solder material covers the wettable layer and the adhesion layer around the barrier layer;

after conducting the metal-filling operation, removing the photoresist layer;

after removing the photoresist layer, conducting a first reflow operation to transform the solder material into a plurality of solder balls having a hemispherical profile, and the solder balls retracting onto the upper surface of the wettable layer without extending onto the adhesion layer;

after conducting the first reflow operation, conducting a second etching operation to remove a portion of the adhesion layer so that only residual adhesion layer underneath the barrier layer is retained and the passivation layer on the wafer is exposed to the outside; and conducting a second reflow operation.

2. The method of claim 1, wherein material constituting the adhesion layer is selected from a group consisting of titanium, titanium-tungsten alloy, aluminum and chromium.

3. The method of claim 2, wherein etchant for etching the adhesion layer in the second etching operation contains hydrogen peroxide ($H_2O_2$), ethylene diaminete traacetic (EDTA) and potassium sulfate ($K_2SO_4$) when the adhesion layer is a titanium-tungsten alloy layer.

4. The method of claim 2, wherein etchant for etching the adhesion layer in the second etching operation contains hydrogen chloride (HCl) when the adhesion layer is a chromium layer.

5. The method of claim 2, wherein etchant for etching the adhesion layer in the second etching operation contains ammonium hydroxide ($NH_4OH$) and hydrogen peroxide ($H_2O_2$) when the adhesion layer is a titanium layer.

6. The method of claim 2, wherein etchant for etching the adhesion layer in the second etching operation contains hydrogen fluoride (HF) when the adhesion layer is a titanium layer.

7. The method of claim 2, wherein etchant for etching the adhesion layer in the second etching operation contains phosphoric acid and acetic acid when the adhesion layer is an aluminum layer.

8. The method of claim 1, wherein material constituting the barrier layer includes nickel-vanadium alloy.

9. The method of claim 8, wherein the etchant for etching the barrier layer in the first etching operation contains sulfuric acid.

10. The method of claim 9, wherein the barrier layer having a thickness between 2000 Å and 4000 Å is etched for over 2 hours at room temperature using a sulfuric acid etchant having a concentration between 1%–98%.

11. The method of claim 9, wherein the barrier layer having a thickness between 2000 Å and 4000 Å is etched for over 2 hours at 80° C. using a sulfuric acid etchant having a concentration between 1%–98%.

12. The method of claim 9, wherein the barrier layer having a thickness between 2000 Å and 4000 Å is etched in the first etching operation by conducting an electrochemical etching operation at room temperature for 20 to 110 seconds using a current density between 0.001~0.02 A/cm$^2$ and sulfuric acid at 10% concentration.

13. The method of claim 8, wherein the barrier layer is etched using diluted phosphoric acid in the first etching operation.

14. The method of claim 1, wherein material constituting the wettable layer is selected from a group consisting of copper, palladium and gold.

15. The method of claim 14, wherein the wettable layer is etched in the first etching operation using an etchant containing ammonium hydroxide and hydrogen peroxide if the wettable layer is a copper layer.

16. The method of claim 14, wherein the wettable layer is etched in the first etching operation using an etchant containing potassium sulfate ($K_2SO_4$) and glycerol if the wettable layer is a copper layer.

17. The method of claim 1, wherein the solder material does not wet the adhesion layer.

18. A method of forming bumps on a silicon wafer having an active surface with a passivation layer and a plurality of bonding pads thereon such that the passivation layer exposes the bonding pads, the method comprising the steps of:

forming an adhesion layer over the active surface of the wafer, the adhesion layer covering both the bonding pads and the passivation layer;

forming a barrier layer over the adhesion layer;

forming a wettable layer over the barrier layer;

conducting a first photolithography process to from a plurality of photoresist blocks on the wettable layer;

conducting a first etching operation to remove the wettable layer and the barrier layer so that only the residual wettable layer and barrier layer underneath the photoresist blocks remain;

after conducting the first etching operation, removing the photoresist blocks;

after removing the photoresist blocks, conducting a second photolithography process to form a photoresist layer over the adhesion layer, wherein the photoresist layer has a plurality of openings that expose the wettable layer and the adhesion layer around the barrier layer;

after conducting the second photolithography process, conducting a metal-filling operation to form a solder material inside the openings of the photoresist layer, wherein the solder material covers the wettable layer and the adhesion layer around the barrier layer;

after conducting the metal-filling operation, conducting a first reflow operation to transform the solder material into a plurality of solder balls having a hemispherical profile, and the solder balls retracting onto the upper surface of the wettable layer without extending onto the adhesion layer;

after conducting the first reflow operation, removing the photoresist layer;

after removing the photoresist layer, conducting a second etching operation to remove a portion of the adhesion layer so that only residual adhesion layer underneath the barrier layer is retained and the passivation layer on the wafer is exposed to the outside; and conducting a second reflow operation.

19. The method of claim 1, wherein material constituting the adhesion layer is selected from a group consisting of titanium, titanium-tungsten alloy, aluminum and chromium.

20. The method of claim 19, wherein etchant for etching the adhesion layer in the second etching operation contains hydrogen peroxide ($H_2O_2$), ethylene diamine tetraacetic (EDTA) and potassium sulfate ($K_2SO_4$) when the adhesion layer is a titanium-tungsten alloy layer.

21. The method of claim 19, wherein etchant for etching the adhesion layer in the second etching operation contains hydrogen chloride (HCl) when the adhesion layer is a chromium layer.

22. The method of claim 19, wherein etchant for etching the adhesion layer in the second etching operation contains ammonium hydroxide ($NH_4OH$) and hydrogen peroxide ($H_2O_2$) when the adhesion layer is a titanium layer.

23. The method of claim 19, wherein etchant for etching the adhesion layer in the second etching operation contains hydrogen fluoride (HF) when the adhesion layer is a titanium layer.

24. The method of claim 19, wherein etchant for etching the adhesion layer in the second etching operation contains phosphoric acid and acetic acid when the adhesion layer is an aluminum layer.

25. The method of claim 18, wherein material constituting the barrier layer includes nickel-vanadium alloy.

26. The method of claim 25, wherein the etchant for etching the barrier layer in the first etching operation contains sulfuric acid.

27. The method of claim 26, wherein the barrier layer having a thickness between 2000 Å and 4000 Å is etched for over 2 hours at room temperature using a sulfuric acid etchant having a concentration between 1%~98%.

28. The method of claim 26, wherein the barrier layer having a thickness between 2000 Å and 4000 Å is etched for over 2 hours at 80° C. using a sulfuric acid etchant having a concentration between 1%~98%.

29. The method of claim 26, wherein the barrier layer having a thickness between 2000 Å and 4000 Å is etched in the first etching operation by conducting an electrochemical etching operation at room temperature for 20 to 110 seconds using a current density between 0.001~0.02 A/cm$^2$ and sulfuric acid at 10% concentration.

30. The method of claim 25, wherein the barrier layer is etched using diluted phosphoric acid in the first etching operation.

31. The method of claim 18, wherein material constituting the wettable layer is selected from a group consisting of copper, palladium and gold.

32. The method of claim 31, wherein the wettable layer is etched in the first etching operation using an etchant containing ammonium hydroxide and hydrogen peroxide if the wettable layer is a copper layer.

33. The method of claim 31, wherein the wettable layer is etched in the first etching operation using an etchant containing potassium sulfate ($K_2SO_4$) and glycerol if the wettable layer is a copper layer.

34. The method of claim 18, wherein material constituting the solder blocks does not wet the adhesive layer.

35. A method of forming bumps over a wafer having an active surface thereon, the method comprising the steps of:

forming a first under-ball metallic layer over the active surface of the wafer;

forming a second under-ball metallic layer over the first under-ball metallic layer, conducting a first photolithography process to form a plurality of photoresist blocks over the second under-ball metallic layer;

conducting a first etching operation to remove the second under-ball metallic layer so that only the second under-ball metallic layer underneath the photoresist blocks remains;

after conducting the first etching operation, removing the photoresist blocks;

after removing the photoresist blocks, conducting a second photolithography process to form a photoresist layer over the first under-ball layer, wherein the photoresist layer has a plurality of openings that expose the second under-ball metallic layer;

after conducting the second photolithography process, conducting a metal-filling operation to fill a solder material into the openings of the photoresist layer, the solder material covering the second under-ball metallic layer, after conducting the metal-filling operation, removing the photoresist layer;

after removing the photoresist layer, conducting a first reflow operation to transform the solder material into a plurality of solder balls; and after conducting the first reflow operation, conducting a second etching operation to remove a portion of the first under-ball metallic layer so that only the first under-ball metallic layer underneath the second under-ball metallic layer remains.

36. The method of claim 35, wherein after conducting the second etching operation, a second reflow operation is conducted.

37. The method of claim 35, wherein the step of forming the second under-ball metallic layer over the first under-ball metallic layer includes the sub-steps of:

forming a barrier layer over the first under-ball metallic layer; and forming a wettable layer over the barrier layer.

38. The method of claim 37, wherein material constituting the barrier layer includes nickel-vanadium alloy.

39. The method of claim 38, wherein the first etching operation is carried out using an etchant containing sulfuric acid.

40. The method of claim 39, wherein the barrier layer having a thickness ranging from 2000 Å to 4000 Å is etched for over 2 hours at room temperature using a sulfuric acid etchant having a concentration between 1%~98%.

41. The method of claim 39, wherein the barrier layer having a thickness ranging from 2000 Å to 4000 Å is etched for over 2 hours at 80° C. using a sulfuric acid etchant having a concentration between 1%~98%.

42. The method of claim 39, wherein the barrier layer having a thickness ranging from 2000 Å to 4000 Å is etched in the first etching operation by conducting an electrochemical etching operation at room temperature for 20 to 110 seconds using a current density between 0.001~0.02 A/cm$^2$ and sulfuric acid at 10% concentration.

43. The method of claim 38, wherein the barrier layer is etched using diluted phosphoric acid in the first etching operation.

44. The method of claim 37, wherein material constituting the wettable layer is selected from a group consisting of copper, palladium and gold.

45. The method of claim 44, wherein the wettable layer is etched in the first etching operation using an etchant containing ammonium hydroxide and hydrogen peroxide if the wettable layer is a copper layer.

46. The method of claim 44, wherein the wettable layer is etched in the first etching operation using an etchant containing potassium sulfate ($K_2SO_4$) and glycerol if the wettable layer is a copper layer.

47. The method of claim 35, wherein the first under-ball metallic layer includes an adhesion layer fabricated using a material selected from a group consisting of titanium, titanium-tungsten alloy, aluminum and chromium.

48. The method of claim 47, wherein etchant for etching the adhesion layer in the second etching operation contains hydrogen peroxide ($H_2O_2$), ethylene diamino tetraacetic (EDTA) and potassium sulfate ($K_2SO_4$) when the adhesion layer is a titanium-tungsten alloy layer.

49. The method of claim 47, wherein etchant for etching the adhesion layer in the second etching operation contains hydrogen chloride (HCl) when the adhesion layer is a chromium layer.

50. The method of claim 47, wherein etchant for etching the adhesion layer in the second etching operation contains ammonium hydroxide ($NH_4OH$) and hydrogen peroxide ($H_2O_2$) when the adhesion layer is a titanium layer.

51. The method of claim 47, wherein etchant for etching the adhesion layer in the second etching operation contains hydrogen fluoride (HF) when the adhesion layer is a titanium layer.

52. The method of claim 47, wherein etchant for etching the adhesion layer in the second etching operation contains phosphoric acid and acetic acid when the adhesion layer is an aluminum layer.

53. The method of claim 35, wherein material constituting the solder blocks does not wet the first under-ball metallic layer.

54. A method of forming bumps over a wafer having an active surface thereon, the method comprising the steps of:

forming a first under-ball metallic layer over the active surface of the wafer;

forming a second under-ball metallic layer over the first under-ball metallic layer, conducting a first photolithography process to form a plurality of photoresist blocks over the second under-ball metallic layer;

conducting a first etching operation to remove the second under-ball metallic layer so that only the second under-ball metallic layer underneath the photoresist blocks remains;

after conducting the first etching operation, removing the photoresist blocks;

after removing the photoresist blocks, conducting a second photolithography process to form a photoresist layer over the first under-ball layer, wherein the photoresist layer has a plurality of openings that expose the second under-ball metallic layer;

after conducting the second photolithography process, conducting a metal-filling operation to fill a solder material into the openings of the photoresist layer, the solder material covering the second under-ball metallic layer;

after conducting the metal-filling operation, conducting a first reflow operation to transform the solder material into a plurality of solder balls;

after conducting the first reflow operation, removing the photoresist layer; and after removing the photoresist layer, conducting a second etching operation to remove a portion of the first under-ball metallic layer so that only the first under-ball metallic layer underneath the second under-ball metallic layer remains.

55. The method of claim 54, wherein after conducting the second etching operation, a second reflow operation is conducted.

56. The method of claim 54, wherein the step of forming the second under-ball metallic layer over the first under-ball metallic layer includes the sub-steps of:

forming a barrier layer over the first under-ball metallic layer; and forming a wettable layer over the barrier layer.

57. The method of claim 56, wherein material constituting the barrier layer includes nickel-vanadium alloy.

58. The method of claim 57, wherein the first etching operation is carried out using an etchant containing sulfuric acid.

59. The method of claim 58, wherein the barrier layer having a thickness between 2000 Å and 4000 Å is etched for over 2 hours at room temperature using a sulfuric acid etchant having a concentration between 1%~98%.

60. The method of claim 58, wherein the barrier layer having a thickness between 2000 Å and 4000 Å is etched for over 2 hours at 80° C. using a sulfuric acid etchant having a concentration between 1%~98%.

61. The method of claim 58, wherein the barrier layer having a thickness between 2000 Å and to 4000 Å is etched in the first etching operation by conducting an electromechanical etching operation at room temperature for 20 to 110 seconds using a current density between 0.001~0.02 A/cm$^2$ and sulfuric acid at 10% concentration.

62. The method of claim 57, wherein the barrier layer is etched using diluted phosphoric acid in the first etching operation.

63. The method of claim 56, wherein material constituting the wettable layer is selected from a group consisting of copper, palladium and gold.

64. The method of claim 63, wherein the wettable layer is etched in the first etching operation using an etchant containing ammonium hydroxide and hydrogen peroxide if the wettable layer is a copper layer.

65. The method of claim 63, wherein the wettable layer is etched in the first etching operation using an etchant containing potassium sulfate ($K_2SO_4$) and glycerol if the wettable layer is a copper layer.

66. The method of claim 54, wherein the first under-ball metallic layer includes an adhesion layer fabricated using a material selected from a group consisting of titanium, titanium-tungsten alloy, aluminum and chromium.

67. The method of claim 66, wherein etchant for etching the adhesion layer in the second etching operation contains hydrogen peroxide ($H_2O_2$), ethylene diamine tetraacetic (EDTA) and potassium sulfate ($K_2SO_4$) when the adhesion layer is a titanium-tungsten alloy layer.

68. The method of claim 66, wherein etchant for etching the adhesion layer in the second etching operation contains hydrogen chloride (HCl) when the adhesion layer is a chromium layer.

69. The method of claim 66, wherein etchant for etching the adhesion layer in the second etching operation contains ammonium hydroxide ($NH_4OH$) and hydrogen peroxide ($H_2O_2$) when the adhesion layer is a titanium layer.

70. The method of claim 66, wherein etchant for etching the adhesion layer in the second etching operation contains hydrogen fluoride (HF) when the adhesion layer is a titanium layer.

71. The method of claim 66, wherein etchant for etching the adhesion layer in the second etching operation contains phosphoric acid and acetic acid when the adhesion layer is an aluminum layer.

72. The method of claim 54, wherein material constituting the solder blocks does not wet the first under-ball metallic layer.

73. A method of forming bumps over a wafer having an active surface thereon, the method comprising the steps of:

forming a first under-ball metallic layer over the active surface of the wafer;

forming a second under-ball metallic layer over the first under-ball metallic layer;

conducting a first photolithography process to form a plurality of photoresist blocks over the second under-ball metallic layer;

conducting a first etching operation to remove the second under-ball metallic layer so that only the second under-ball metallic layer underneath the photoresist blocks remains;

after conducting the first etching operation, removing the photoresist blocks;

after removing the photoresist blocks, conducting a second photolithography process to form a photoresist layer over the first under-ball layer, wherein the photoresist layer has a plurality of openings that expose the second under-ball metallic layer;

after conducting the second photolithography process, conducting a metal-filling operation to fill a solder material into the openings of the photoresist layer, the solder material covering the second under-ball metallic layer;

after conducting the metal-filling operation, removing the photoresist layer;

after removing the photoresist layer, conducting a first reflow operation to transform the solder material into a plurality of solder balls; and after conducting the first reflow operation, conducting a second etching operation to remove a portion of the first under-ball metallic layer so that only the first under-ball metallic layer underneath the second under-ball metallic layer remains.

74. The method of claim 73, wherein after conducting the second etching operation, a second reflow operation is conducted.

75. The method of claim 73, wherein the first reflux operation is carried out after the photoresist layer is removed.

76. The method of claim 73, wherein the photoresist layer is removed after the first reflux operation is earned out.

77. The method of claim 73, wherein the step of forming the second under-ball metallic layer over the first under-ball metallic layer includes the sub-steps of:

forming a barrier layer over the first under-ball metallic layer; and forming a wettable layer over the barrier layer.

78. The method of claim 77, wherein material constituting the barrier layer includes nickel-vanadium alloy.

79. The method of claim 78, wherein the first etching operation is carried out using an etchant containing sulfuric acid.

80. The method of claim 79, wherein the barrier layer having a thickness between 2000 Å and to 4000 Å is etched for over 2 hours at room temperature using a sulfuric acid etchant having a concentration between 1%~98%.

81. The method of claim 79, wherein the barrier layer having a thickness between 2000 Å and to 4000 Å is etched for over 2 hours at 80° C. using a sulfuric acid etchant having a concentration between 1%~98%.

82. The method of claim 79, wherein the barrier layer having a thickness between 2000 Å and to 4000 Å is etched in the first etching operation by conducting an electrochemical etching operation at room temperature for 20 to 110 seconds using a current density between 0.001~0.02 A/cm$^2$ and sulfuric acid at 10% concentration.

83. The method of claim 78, wherein the barrier layer is etched using diluted phosphoric acid in the first etching operation.

84. The method of claim 77, wherein material constituting the wettable layer is selected from a group consisting of copper, palladium and gold.

85. The method of claim 84, wherein the wettable layer is etched in the first etching operation using an etchant containing ammonium hydroxide and hydrogen peroxide if the wettable layer is a copper layer.

86. The method of claim 84, wherein the wettable layer is etched in the first etching operation using an etchant containing potassium sulfate ($K_2SO_4$) and glycerol if the wettable layer is a copper layer.

87. The method of claim 73, wherein the first under-ball metallic layer includes an adhesion layer fabricated using a material selected from a group consisting of titanium, titanium-tungsten alloy, aluminum and chromium.

88. The method of claim 87, wherein etchant for etching the adhesion layer in the second etching operation contains hydrogen peroxide ($H_2O_2$), ethylene diamine tetraacetic (EDTA) and potassium sulfate ($K_2SO_4$) when the adhesion layer is a titanium-tungsten alloy layer.

89. The method of claim 87, wherein etchant for etching the adhesion layer in the second etching operation contains hydrogen chloride (HCl) when the adhesion layer is a chromium layer.

90. The method of claim 87, wherein etchant for etching the adhesion layer in the second etching operation contains ammonium hydroxide ($NH_4OH$) and hydrogen peroxide ($H_2O_2$) when the adhesion layer is a titanium layer.

91. The method of claim 87, wherein etchant for etching the adhesion layer in the second etching operation contains hydrogen fluoride (HF) when the adhesion layer is a titanium layer.

92. The method of claim 87, wherein etchant for etching the adhesion layer in the second etching operation contains phosphoric acid and acetic acid when the adhesion layer is an aluminum layer.

93. The method of claim 73, wherein material constituting the solder blocks does not wet the first under-ball metallic layer.

94. A method of forming bumps over the active surface of a wafer, the method comprising the steps of:

forming a first under-ball metallic layer over the active surface of the wafer;

forming a second under-ball metallic layer over the first under-ball metallic layer;

removing a portion of the second under-ball metallic layer to expose the first under-ball metallic layer to the outside;

after removing a portion of the second under-ball metallic layer, forming a solder material over the second under-ball metallic layer;

after forming the solder material over the second under-ball metallic layer, conducting a first reflow operation; and after conducting the first reflow operation, removing a portion of the first under-ball metallic layer so that the first under-ball metallic layer underneath the second under-ball metallic layer remains.

95. The method of claim 94, wherein after conducting the second etching operation, a second reflow operation is conducted.

96. The method of claim 94, wherein the step of forming the second under-ball metallic layer over the first under-ball metallic layer includes the sub-steps of:

forming a barrier layer over the first under-ball metallic layer; and forming a wettable layer over the barrier layer.

97. The method of claim 96, wherein material constituting the barrier layer includes nickel-vanadium alloy.

98. The method of claim 97, wherein the first etching operation is carried out using an etchant containing sulfuric acid.

99. The method of claim 98, wherein the barrier layer having a thickness between 2000 Å and 4000 Å is etched for over 2 hours at room temperature using a sulfuric acid etchant having a concentration between 1%~98%.

100. The method of claim 98, wherein the barrier layer having a thickness between 2000 Å and 4000 Å is etched for over 2 hours at 80° C. using a sulfuric acid etchant having a concentration between 1%~98%.

101. The method of claim 98, wherein the barrier layer having a thickness between 2000 Å and 4000 Å is etched in the first etching operation by conducting an electrochemical etching operation at room temperature for 20 to 110 seconds using a current density between 0.001~0.02 A/cm$^2$ and sulfuric acid at 10% concentration.

102. The method of claim 97, wherein the barrier layer is etched using diluted phosphoric aid in the first etching operation.

103. The method of claim 96, wherein material constituting the wettable layer is selected from a group consisting of copper, palladium and gold.

104. The method of claim 103, wherein the wettable layer is etched in the first etching operation using an etchant containing ammonium hydroxide and hydrogen peroxide if the wettable layer is a copper layer.

105. The method of claim 103, wherein the wettable layer is etched in the first etching operation using an etchant containing potassium sulfate ($K_2SO_4$) and glycerol if the wettable layer is a copper layer.

106. The method of claim 94, wherein the first under-ball metallic layer includes an adhesion layer fabricated using a material selected from a group consisting of titanium, titanium-tungsten alloy, aluminum and chromium.

107. The method of claim 106, wherein the exposed first under-ball metallic layer is removed by etching and etchant for etching the adhesion layer contains hydrogen peroxide ($H_2O_2$), ethylene diamine tetraacetic (EDTA) and potassium sulfate ($K_2SO_4$) when the adhesion layer is a titanium-tungsten alloy layer.

108. The method of claim 106, wherein the exposed first under-ball metallic layer is removed by etching and etchant for etching the adhesion layer contains hydrogen chloride (HCl) when the adhesion layer is a chromium layer.

109. The method of claim 106, wherein the exposed first under-ball metallic layer is removed by etching and etchant for etching the adhesion layer contains ammonium hydroxide ($NH_4OH$) and hydrogen peroxide ($H_2O_2$) when the adhesion layer is a titanium layer.

110. The method of claim 106, wherein the exposed first under-ball metallic layer is removed by etching and etchant for etching the adhesion layer contains hydrogen fluoride (HF) when the adhesion layer is a titanium layer.

111. The method of claim 106, wherein the exposed first under-ball metallic layer is removed by etching and etchant for etching the adhesion layer contains phosphoric acid and acetic acid when the adhesion layer is an aluminum layer.

112. The method of claim 94, wherein material constituting the solder blocks does not wet the first under-ball metallic layer.

* * * * *